US 9,094,029 B2

(12) United States Patent
Xu et al.

(10) Patent No.: US 9,094,029 B2
(45) Date of Patent: Jul. 28, 2015

(54) SYSTEMS AND METHODS FOR ORDERING CODEWORDS BASED ON POSTERIOR INFORMATION IN SUCCESSIVE INTERFERENCE CANCELLATION (SIC) RECEIVERS

(71) Applicant: Marvell World Trade Ltd., St. Michael (BB)

(72) Inventors: Mingguang Xu, Sunnyvale, CA (US); Yakun Sun, Sunnyvale, CA (US); Hui-Ling Lou, Sunnyvale, CA (US)

(73) Assignee: MARVELL WORLD TRADE LTD., St. Michael (BB)

( * ) Notice: Subject to any disclaimer, the term of this patent is extended or adjusted under 35 U.S.C. 154(b) by 0 days.

(21) Appl. No.: 14/263,753

(22) Filed: Apr. 28, 2014

(65) Prior Publication Data

US 2014/0327559 A1   Nov. 6, 2014

Related U.S. Application Data

(60) Provisional application No. 61/819,429, filed on May 3, 2013.

(51) Int. Cl.
| | |
|---|---|
| *H03M 7/00* | (2006.01) |
| *H03M 13/00* | (2006.01) |
| *H04B 7/04* | (2006.01) |
| *H04L 1/00* | (2006.01) |
| *H03M 13/09* | (2006.01) |
| *H03M 13/11* | (2006.01) |
| *H03M 13/23* | (2006.01) |
| *H03M 13/29* | (2006.01) |

(52) U.S. Cl.
CPC .......... *H03M 7/00* (2013.01); *H03M 13/6331* (2013.01); *H04B 7/04* (2013.01); *H04L 1/0048* (2013.01); *H03M 13/09* (2013.01); *H03M 13/1102* (2013.01); *H03M 13/23* (2013.01); *H03M 13/2957* (2013.01)

(58) Field of Classification Search
CPC ....... H03M 7/00; H03M 13/09; H03M 13/23; H03M 13/2957; H03M 13/6331; H04B 7/0413; H04B 7/0456; H04J 11/004; H04L 25/03305; H04L 1/0048
USPC ........... 341/107; 714/704, 748; 370/280, 281, 370/252, 329; 375/227, 267, 346, 316, 260, 375/308, 350, 148, 349
See application file for complete search history.

(56) References Cited

U.S. PATENT DOCUMENTS

| | | |
|---|---|---|
| 6,108,374 A | 8/2000 | Balachandran et al. |
| 6,584,115 B1 | 6/2003 | Suzuki |
| 7,173,979 B1 | 2/2007 | Badri et al. |

(Continued)

OTHER PUBLICATIONS

Gerard J. Foschini, Layered space-time architecture for wireless communication in a fading environment when using multi-element antennas, Bell Labs Technical Journal, Autumn 1996, pp. 41-59.

*Primary Examiner* — Lam T Mai

(57) ABSTRACT

Systems and methods are provided for determining a decoding order in a successive interference cancellation receiver. The method includes receiving, using control circuitry, a plurality of codewords. The method further includes computing at least one ordering metric for at least one of the plurality of codewords based on posterior information associated with the plurality of codewords, and determining the decoding order based on the at least one ordering metric.

20 Claims, 6 Drawing Sheets

(56) References Cited

U.S. PATENT DOCUMENTS

| | | |
|---|---|---|
| 7,209,522 B1 | 4/2007 | Shirali |
| 7,373,582 B2 | 5/2008 | Park et al. |
| 8,072,899 B2 | 12/2011 | Pan et al. |
| 8,149,957 B2 | 4/2012 | Oh et al. |
| 8,185,798 B2 | 5/2012 | Oteri et al. |
| 8,301,956 B2 | 10/2012 | Pi et al. |
| 8,335,286 B2 | 12/2012 | Mergen et al. |
| 8,351,524 B2 | 1/2013 | Zhou |
| 8,397,150 B1 | 3/2013 | Nieminen et al. |
| 8,539,288 B1 * | 9/2013 | Sun et al. ............ 714/704 |
| 8,630,379 B1 | 1/2014 | Sun et al. |
| 8,687,751 B1 | 4/2014 | Lee et al. |
| 8,769,352 B1 * | 7/2014 | Sun et al. ............ 714/704 |
| 2005/0063378 A1 | 3/2005 | Kadous |
| 2008/0034274 A1 | 2/2008 | Song et al. |
| 2008/0297415 A1 | 12/2008 | Berens et al. |
| 2009/0225889 A1 | 9/2009 | Tsai et al. |
| 2010/0002598 A1 | 1/2010 | Pan et al. |
| 2010/0271988 A1 | 10/2010 | Jia et al. |
| 2011/0268019 A1 | 11/2011 | Tang et al. |
| 2012/0069757 A1 | 3/2012 | Jiang et al. |

\* cited by examiner

400

410 ↘

$$\Pi^{(t)} = \left\{ (L_1, \cdots, L_C) \middle| \frac{\sum_{k=1}^{D(L_1)} p_{k,l_1}(t)/D(L_1)}{R_{L_1}(t)} \geq \frac{\sum_{k=1}^{D(L_2)} p_{k,l_2}(t)/D(L_2)}{R_{L_2}(t)} \geq \cdots \geq \frac{\sum_{k=1}^{D(L_C)} p_{k,l_C}(t)/D(L_C)}{R_{L_C}(t)} \right\}$$

430 ↘

$$\Pi^{(t)} = \left\{ (L_1, \cdots, L_C) \middle| \frac{1}{D(L_1)} \sum_{k=1}^{D(L_1)} |LLR(k, L_1)| \geq \cdots \geq \frac{1}{D(L_C)} \sum_{k=1}^{D(L_C)} |LLR(k, L_C)| \right\}.$$

450 ↘

$$\Pi^{(t)} = \left\{ (L_1, \cdots, L_C) \middle| \frac{1}{D(L_1)} \sum_{k=1}^{D(L_1)} P_e(k, L_1) \leq \frac{1}{D(L_2)} \sum_{k=1}^{D(L_2)} P_e(k, L_2) \leq \cdots \leq \frac{1}{D(L_C)} \sum_{k=1}^{D(L_C)} P_e(k, L_C) \right\}$$

470 ↘

$$\Pi^{(t)} = \left\{ (L_1, \cdots, L_C) \middle| \frac{\sum_{k=1}^{D(L_1)} MI(k, L_1)/D(L_1)}{R_{L_1}(t)} \geq \frac{\sum_{k=1}^{D(L_2)} MI(k, L_2)/D(L_2)}{R_{L_2}(t)} \geq \cdots \geq \frac{\sum_{k=1}^{D(L_C)} MI(k, L_C)/D(L_C)}{R_{L_C}(t)} \right\}$$

490 ↘

$$\Pi^{(t)} = \left\{ (L_1, \cdots, L_C) \middle| \frac{\text{median}(\{MI(k, L_1), k = 1, \ldots, D(L_1)\})}{R_{L_1}(t)} \geq \cdots \geq \frac{\text{median}(\{MI(k, L_C), k = 1, \ldots, D(L_C)\})}{R_{L_C}(t)} \right\}$$

FIG. 4

SYSTEMS AND METHODS FOR ORDERING CODEWORDS BASED ON POSTERIOR INFORMATION IN SUCCESSIVE INTERFERENCE CANCELLATION (SIC) RECEIVERS

CROSS REFERENCE TO RELATED APPLICATION

This disclosure claims the benefit under 35 U.S.C. §119(e) of U.S. Provisional Application No. 61/819,429, filed on May 3, 2013, which is hereby incorporated herein by reference in its entirety.

FIELD OF USE

The present disclosure relates generally to systems and methods for ordering codewords in receivers that employ successive interference cancellation (SIC) techniques. More particularly, the disclosure discusses the determination of a decoding order based on posterior information.

BACKGROUND OF THE DISCLOSURE

The disclosed technology relates to communications systems, and more particularly, to performing successive interference cancellation (SIC) in communications systems with or without retransmissions.

In a data transmission system, it is desirable for information, often grouped into packets, to be accurately received at a destination. A transmitter at or near the source sends the information provided by the source via a signal or signal vector. A receiver at or near the destination processes the signal sent by the transmitter. The medium, or media, between the transmitter and receiver, through which the information is sent, may corrupt the signal such that the receiver is unable to correctly reconstruct the transmitted information. Therefore, given a transmission medium, sufficient reliability is obtained through careful design of the transmitter and/or receiver, and of their respective components.

Successive interference cancellation (SIC) is a technique for improving the performance of a data transmission system. According to this technique, a received codeword that is associated with a small amount of corruption (e.g., due to favorable channel conditions), is decoded before other codewords that are associated with larger amounts of corruption. Effects of the decoded codeword are subtracted from a received signal vector to eliminate interference due to the decoded codeword from the other codewords. In this way, the other codewords may experience less interference and are able to achieve a high signal-to-noise ratio (SNR) than without interference cancellation.

The order in which codewords are decoded is an important design consideration. Conventional SIC methods decode codewords in an order that is based on information that reflects long-term channel conditions or channel performance, such as a long-term signal-to-noise ratio. However, because channel and interference conditions may change rapidly, such information may not accurately reflect the conditions pertaining to a specific transmission attempt (e.g., in a specific subframe of the communication system).

SUMMARY OF THE DISCLOSURE

In accordance with an embodiment of the present disclosure, a method for decoding in a successive interference cancellation receiver is provided. A plurality of codewords is received, and at least one ordering metric, for at least one of the plurality of codewords, is computed based on posterior information associated with the plurality of codewords. Further, a decoding order for the plurality of codewords is determined based on the at least one ordering metric.

In accordance with an embodiment of the present disclosure, a receiver for decoding codewords using successive interference cancellation is provided. The receiver includes control circuitry configured to receive a plurality of codewords. The receiver further includes decoding circuitry configured to compute at least one ordering metric for at least one of the plurality of codewords based on posterior information associated with the plurality of codewords. The decoding circuitry is further configured to determine a decoding order for the plurality of codewords based on the at least one ordering metric.

In some implementations, the posterior information includes at least one of log-likelihood ratio (LLR) information, mutual information, and bit error rate (BER) information.

In some implementations, the at least one ordering metric is further based on a coding rate corresponding to the at least one of the plurality of codewords.

BRIEF DESCRIPTION OF THE DRAWINGS

The above and other aspects and potential advantages of the present disclosure will be apparent upon consideration of the following detailed description, taken in conjunction with the accompanying drawings, in which like reference characters refer to like parts throughout, and in which:

FIG. 4 illustrates several examples of ordering codewords based on posterior information, in accordance with some embodiments of the present disclosure;

DETAILED DESCRIPTION

The present disclosure generally relates to performing successive interference cancellation (SIC) in a transmission system that potentially utilizes retransmissions. In one aspect, the codeword ordering may be based on posterior information associated with the codewords to be decoded.

Figure 1:
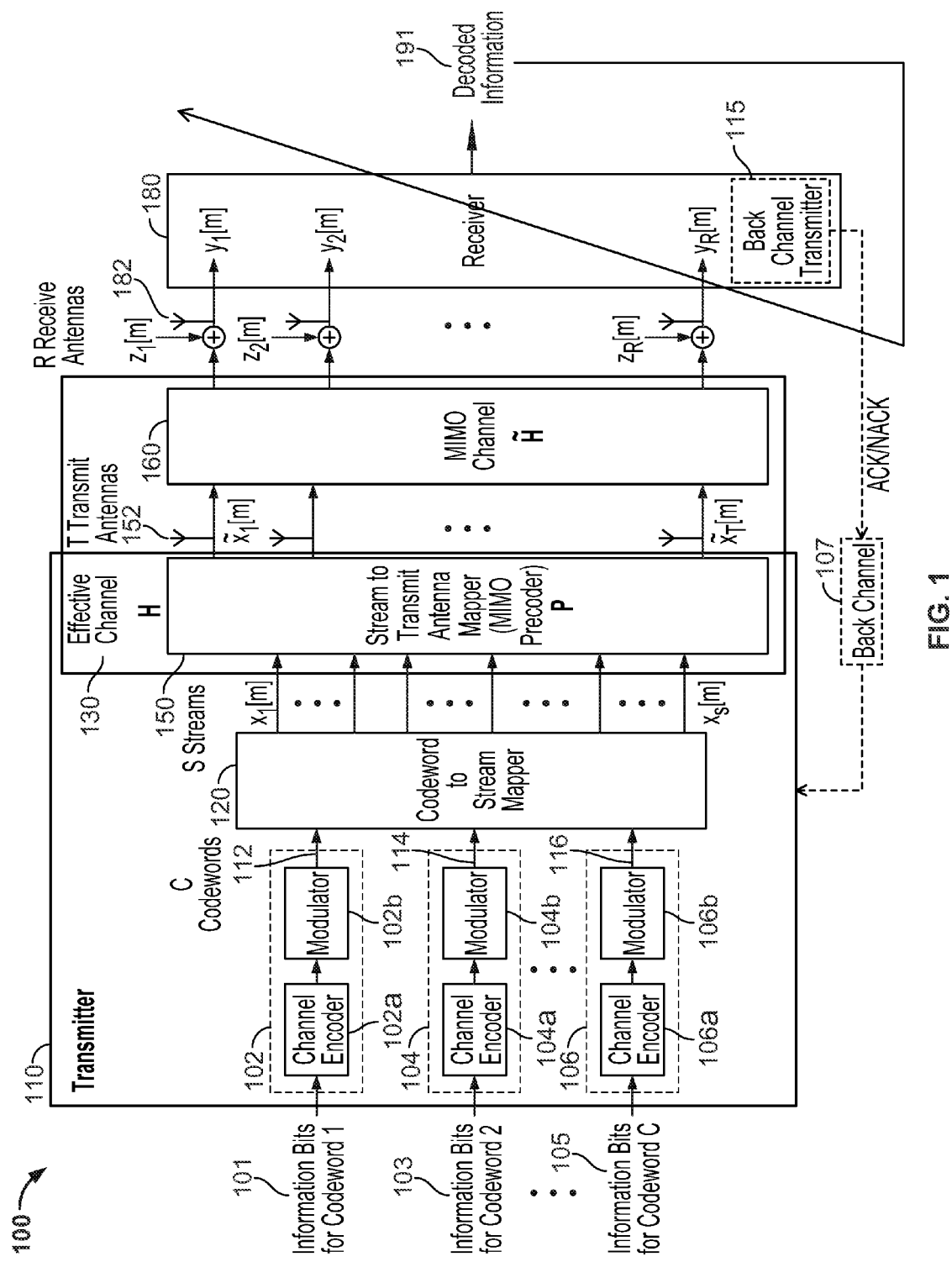
FIG. 1 is a high level block diagram of a data transmission system, in accordance with some embodiments of the present disclosure.

FIG. 1 shows an illustration of a data transmission system 100 in accordance with some embodiments of the present disclosure. The system of FIG. 1 includes transmitter 110, channel 160, and receiver 180. In some embodiments, data to be transmitted may be divided between a large number of transmission systems such as system 100, where each system corresponds to one parallel transmission. For example, system 100 may correspond to a transmission on a portion of the system bandwidth (e.g., on one or more subcarriers) that carries data in a particular frequency range. In some embodiments the illustrated system may represent a wireless communication system. In these embodiments, transmitter 110 may be a wireless transmitter (e.g., a wireless router or a base station) and receiver 180 may be a wireless receiver (e.g., a mobile phone, laptop, or hand-held device). The components shown in transmitter 110 and receiver 180 may be implemented by a single integrated circuit (IC) or as separate components in a circuit board or implemented on a programmable logic device. These components may be implemented on separate devices or circuits and networked together.

Transmitter 110 may process C information bit sequences to produce C codewords using encoder and modulator blocks. For example, encoder and modulator blocks 102, 104, and 106 may process bit sequences 101, 103, and 105, to output codewords 112, 114, and 116, respectively. Although the present disclosure is described in terms of binary data, the bit sequences 101, 103, and 105 may be replaced with a sequence of non-binary digits or another type of information containing symbol without departing from the scope of the present disclosure. In some embodiments, encoder and modulator blocks 102, 104, and 106 may include encoders 102a, 104a, and 106a, respectively. These blocks may employ error correction or error detection codes to encode bit sequences 101, 103, and 105. For example, encoders 102a, 104a, and 106a may encode bit sequences 101, 103, and 105 using convolutional codes, Turbo codes, LDPC codes, or other suitable codes. Error detection information, such as in the form of a cyclic redundancy check (CRC) may be added to the encoded bits. Encoder and modulator blocks 102, 104, and 106 may additionally include modulators 102b, 104b, and 106b respectively, to modulate the encoded bit sequences associated with bit sequences 101, 103 and 105 based on any appropriate modulation scheme, such as quadrature amplitude modulation (QAM), pulse amplitude modulation (PAM), or phase shift keying (PSK). Although encoder and modulator blocks 102, 104, and 106 are illustrated as separate blocks, these blocks may be implemented as one or multiple encoder and modulator units.

Codeword to stream mapper 120 may process the C codewords output by the encoder and modulator blocks (e.g., encoder and modulator blocks 112, 114, and 116) to output S streams. These S streams are represented by coded values $x_1[m]$ through $x_S[m]$, where m is a transmission index associated with a transmission instance. A transmission instance may be defined in the time domain or in the frequency domain or any combination thereof. In some embodiments m may refer to the index of symbols sent in the time domain. In some embodiments, m may represent the index of a subcarrier. All S streams $x_1[m]$ though $x_S[m]$ may be collectively referred to as an S×1 stream vector x(m) such that:

$$x(m)=[x_1[m], \ldots, x_S[m]]^T.$$

Streams $x_1[m]$ through $x_S[m]$ may be input into MIMO precoder 150. MIMO precoder 150 may map streams $x_1[m]$ through $x_S[m]$ to transmit values $\tilde{x}_1[m]$ through $\tilde{x}_T[m]$, where T is the number of transmit antennas with T≥S. These transmit values may be grouped in a T×1 vector $\tilde{x}(m)$, which will be referred to hereinafter as transmit vector $\tilde{x}(m)$, where:

$$\tilde{x}(m)=[\tilde{x}_1[m], \ldots, \tilde{x}_T[m]]^T.$$

This mapping from stream vector x to transmit vector $\tilde{x}$ may be performed using a linear precoding operation. For example, MIMO precoder 150 may generate transmit vector $\tilde{x}(m)$ by multiplying stream vector x(m) by a T×S precoding matrix P, such that $$\tilde{x}(m)=P(m)x(m). \qquad \text{EQ. (1)}$$

Precoding matrix P may be chosen to implement certain transmission schemes. In some embodiments, precoding matrix P may be selected such that multiple copies of the same data stream $x_1[m]$ are sent across a number of transmit antennas to improve the reliability of data transfer. This redundancy results in a higher chance of being able to use one or more of the received copies to reconstruct the transmitted signals at the receiver. Alternatively, the precoding matrix may be selected to transmit multiple data streams in parallel, such as to increase the achievable data rate of the communications link. Techniques such as closed-loop spatial multiplexing or other forms of beamforming may be employed.

Transmit values $\tilde{x}_1[m]$ through $\tilde{x}_T[m]$ may be transmitted using T transmit antennas at transmitter 110. For example, $\tilde{x}_1[m]$ may be transmitted through transmit antenna 152. During transmission $\tilde{x}_1[m]$ through $\tilde{x}_T[m]$ may be altered by a transmission medium, represented by channel 160, and additive noise sources $z_1[m]$ through $z_R[m]$. In a wireless communication system, channel 160 may be the physical space between the transmit and receiver antennas, which obstructs and attenuates the transmitted signals due to at least time-varying multipath fading and shadowing effects. Additive noise sources $z_1[m]$ through $z_R[m]$ may, for example, be ambient electromagnetic interference. In some scenarios, noise sources $z_1[m]$ through $z_R[m]$ may be modeled as additive white Gaussian noise (AWGN) with zero mean. Also, in many applications, channel 160 may be time invariant, meaning that the properties of the channel do not substantially change over an appropriate time scale. In real-time data transmission systems, an appropriate time scale may be in the millisecond range.

Receiver 180 may receive signals $y_1[m]$ through $y_R[m]$ using R receiver antennas such as receiver antenna 182. These received signals will be collectively referred to as the m-th received vector y(m), or simply the received vector y, where:

$$y(m)=[y_1[m], \ldots, y_R[m]]^T.$$

Receiver 180 may include any suitable number of receiver antennas, and therefore R may be any integer of at least S. Signals $y_1[m]$ through $y_R[m]$ may include information from one or more of signals $\tilde{x}_1[m]$ through $\tilde{x}_T[m]$ that have been attenuated and/or corrupted by channel 160 and noise sources $z_1[m]$ through $z_R[m]$. Receiver 180 may process the received signals to produce output bit sequence 191. The processing done by receiver 180 may include demodulation and decoding. Alternatively output bit sequence 191 may be directed to a decoder (not shown) external to receiver 180. Decoded information 191 may be used to adapt the receiver processing performed by receiver 180, as will be described in more detail below.

Because of the multiple transmit antennas of transmitter 110 and the possibly multiple receiver antennas of receiver 180, channel 160 may sometimes be referred to as a MIMO channel with T inputs (from transmitter 110) and R outputs (from receiver 180), or simply a T×R MIMO channel. Due to channel properties, the signal received by each of the R receiver antennas may be based on signals from multiple transmit antennas. In particular, a signal received by each receiver antenna may be a linear combination of the signals provided by the transmit antennas. Thus, in matrix form, the m-th received vector y(m) may be modeled by:

$$y(m)=\tilde{H}(m)\tilde{x}(m)+z(m), m=1, \ldots, M, \qquad \text{EQ. (2)}$$

where M is the total number of received coded symbol vectors, y is the R×1 received vector representing the signals received by the R receiver antennas of receiver 180, and $\tilde{H}$ is a T×R matrix representing the effect of channel 160 on transmit vector x̃ and may sometimes be referred to as a channel response matrix. Vector x̃ is a T×1 vector containing the transmit values transmitted by the T transmit antennas of transmitter 110, and z is an R×1 signal vector representing additive noise, where $$z(m)=[z_1[m], \ldots, z_R[m]]^T.$$

By substituting EQ. 1 into EQ. 2, one can compute an effective transmission channel relating the stream vector x to the received vector y as follows:

$$y(m)=\tilde{H}(m)P(m)x(m)+z(m)=H(m)x(m)+z(m), \quad \text{EQ. (3)}$$

where $\tilde{H}(m)$ represents the actual channel characteristics used in channel 160 and $$H(m)=\tilde{H}(m)P(m)=[h_1[m], \ldots, h_S[m]]$$

is an R×S matrix representing the effective transmission channel as modified by precoder 150. In some embodiments, the precoding matrix P can be chosen such that an effective transmission channel H(m) is created that maximizes the diversity gain of the system. For example, precoding matrix P may be chosen to change the apparent characteristics of the channel so that the effective channel matrix is closer to an orthogonal matrix than the actual channel matrix. Precoding matrix P may be a Givens rotation matrix, a Vandermonde matrix, a Fourier matrix, a Hadamard matrix, or another type of matrix.

Each codeword, e.g., codeword 112, may be mapped to a set of streams $x_{i_1}[m]$ through $x_{i_{c(i)}}[m]$, where c(i) denotes the total number of streams corresponding to codeword i and $1 \le c(i) \le S$. In other words, an i-th codeword (equivalently codeword i, or codeword associated with index i) may be associated with a set of stream indices $S_i=\{i_1, i_2, \ldots, i_{c(i)}\}$, such that the stream vector $x_i(m)$ coming from the i-th codeword is expressed as:

$$x_i(m)=[x_{i_1}[m], \ldots, x_{i_{c(i)}}[m]]^T.$$

Similarly, the channels corresponding to the i-th codeword may be expressed using stream indices from the stream set $S_i$ as follows:

$$H_i(m)=[h_{i_1}[m], \ldots, h_{i_{c(i)}}[m]]^T.$$

In some embodiments, transmitter 110 and receiver 180 may employ a retransmission protocol that allows transmitter 110 to transmit information bits 101, 103, or 105 to receiver 180 multiple times. For example, transmitter 110 and receiver 180 may employ an automatic repeat request (ARQ) or hybrid automatic repeat request (HARQ) scheme. When an ARQ or HARQ scheme is used, receiver 180 may include back channel transmitter 115. Back channel transmitter 115 may be operable to send acknowledgement signals back to transmitter 110 through backchannel 107. An affirmative acknowledgement signal may be sent by back channel transmitter 115 in response to a successful transmission, while a negative or no acknowledgement signal may be sent if a transmission is not successful. A successful transmission is one where the received signal y is reconstructed and accepted by receiver 180. Receiver 180 may accept reconstructed information when, for example, receiver 180 does not detect any errors (e.g., from a cyclic redundancy check) in the reconstructed information. The reconstruction process may include decoding, diversity combining, signal processing, another technique, or a combination thereof.

While the present disclosure is described primarily with respect to ARQ and HARQ retransmission protocols, other retransmission protocols may also be used. For example, a transmission system may employ a repetition coding and transmission protocol, where a fixed number of retransmissions is sent for every data packet that is transmitted irrespective of the number of transmissions needed by the receiver. In this case, because retransmission requests may not be needed to implement the retransmission protocol, transmitter 115 may not be needed.

A transmission may be defined as a Transmission Time Interval (TTI) and a transmission time t may be defined as the index of a particular TTI. For example, in the Long Term Evolution (LTE) protocol, a subframe may correspond to a TTI for the Physical Downlink Shared Channel (PDSCH), and transmission time t may correspond to an identifier of the subframe (e.g., t=Subframe_ID). From a plurality of C codewords transmitted at a transmission time t, each codeword i of the C codewords may have been transmitted by transmitter 110 for a different number of transmission attempts $k_i$. For example, a transmission time t may correspond to a second transmission attempt of codeword 1 ($k_1=2$) and a first transmission attempt of codeword 2 ($k_2=1$). The transmission time t corresponding to the $k_i$-th transmission attempt of codeword i may be expressed using function $t_i(\cdot)$ as follows:

$$t=t_i(k_i).$$

In the following description, the transmission time t may sometimes be omitted to simplify the notation.

The system model of EQ. 3 may be extended to account for the retransmission capabilities of MIMO system 100 as follows:

$$y(m) = H(m)x(m) + z(m) = \sum_{i=1}^{C} H_i^{(k_i)}(m)x_i^{(k_i)}(m) + z(m),$$

where y is the R×1 received vector representing the signals received by the R receiver antennas of receiver 180 at a receiving time corresponding to transmission time t, and z is an R×1 signal vector representing additive noise with noise variance $\sigma^{(t)^2}$ associated with transmission time t. Channel H is a T×R matrix representing the effect of channel 160 on transmit vector x. Channel H may be expressed using channel components $H_i^{(k_i)}$ (i=1, . . . , C), where each channel component $H_i^{(k_i)}$ represents the portion of channel H corresponding to codeword i under its $k_i$-th transmission attempt at time t. Channel H may also be expressed using channel components $h_s(m;t)$ (s=1, . . . , S), where each channel component $h_s(m;t)$ represents the portion of channel H corresponding to stream s transmitted at transmission time t. Both representations of channel H are shown in the following:

$$H(m;t)=H(m)=[H_1^{(k_1)}(m) \ldots H_C^{(k_C)}(m)]=[h_1(m;t) \ldots h_S(m;t)].$$

Vector x is a T×1 vector containing the transmit values transmitted by the T transmit antennas of transmitter 110 at transmission time t as follows:

$$x(m;t)=x(m)=[x_1^{(k_1)^T}(m) \ldots x_C^{(k_C)^T}(m)]^T.$$

At the transmission time t, each transmit value $x_i^{(k_i)}$ may correspond to a transmission attempt $k_i$. In the following description and for purposes of illustration, x(m;t) may be simply denoted as x(m) or x.

The same transmit values may be transmitted during multiple transmission attempts of a same codeword. Alternatively, different transmit values may be transmitted. For example, a transmit value $x_i^{(k)}(m)$ of a codeword i transmitted during transmission attempt k may be different from a transmit value $x_i^{(j)}(m)$ of the same codeword i transmitted during another transmission attempt j. This is the case, for example, when incremental redundancy (IR HARQ) is used in successive transmissions.

One technique for improving the performance of a MIMO system, e.g., the system 100 of FIG. 1, is to use successive interference cancellation (SIC). According to this technique, a codeword containing a smaller amount of signal corruption due to noise, interference, or other sources may be decoded first, before other codewords associated with a larger amount of signal corruption. Effects of the decoded codeword on other codewords may be subtracted from a received signal vector, e.g., received vector y of FIG. 1, to eliminate the interference of the decoded codeword on the other codewords.

SIC can be implemented in a number of ways. For example, SIC can be implemented such that all codewords are decoded in parallel, such that one codeword is serially decoded at each stage, or such that any arbitrary number of codewords is decoded simultaneously at each stage. Techniques for implementing SIC are described, for example, in co-pending, commonly-assigned U.S. patent application Ser. No. 13/047,056, entitled "MULTIPLE-INPUT MULTIPLE-OUTPUT RECEIVERS USING SUCCESSIVE INTERFERENCE CANCELLATION BASED ON CYCLE REDUNDANCY CHECK" and, filed Apr. 2, 2010, which is hereby incorporated by reference herein in its entirety. Hereafter, and for the purposes of illustration, this disclosure will primarily discuss the serial SIC implementation. The systems and methods of this disclosure, however, may apply to other implementations of SIC. For example, any SIC implementation (e.g., serial or parallel) may use the SIC ordering generated using the techniques described herein.

Figure 2:
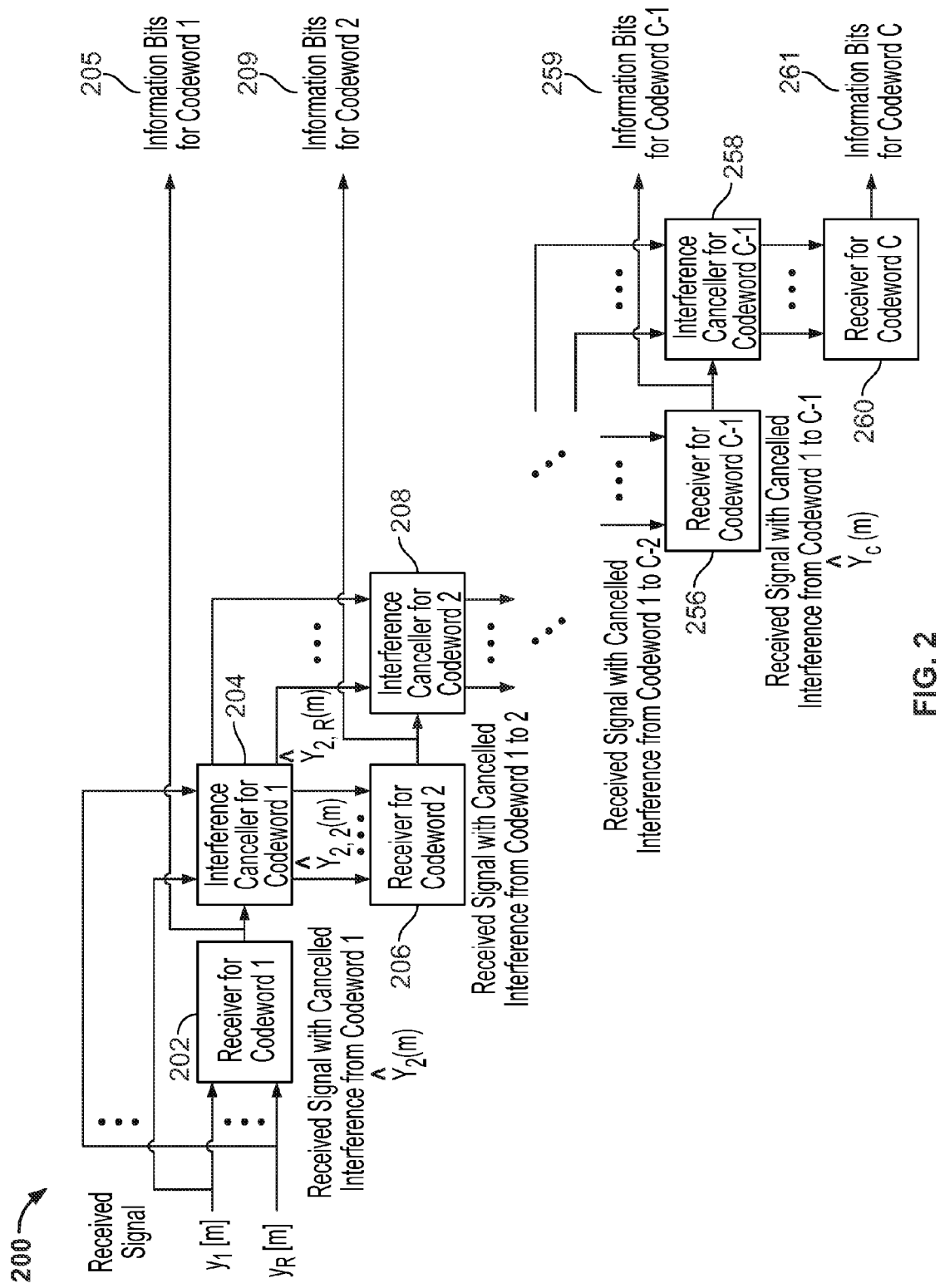
FIG. 2 is a high-level block diagram of a successive interference cancellation (SIC) system, in accordance with some embodiments of the present disclosure.

FIG. 2 illustrates a block diagram of system 200 for performing SIC according to some embodiments. System 200 may include C decoding stages 1, 2, ..., C for respectively decoding codewords $L_1, L_2, \ldots, L_C$. For ease of illustration, only 4 of the stages are shown, and the stages are chosen to correspond, respectively, to codewords 1, 2, ..., C in that order (i.e., $L_1=1, L_2=2, \ldots, L_C=C$). However, any desired ordering of codewords may be used, as will be explained in further detail below.

Each stage, except the last stage, may include a receiver block for a codeword i and an interference canceller associated with that codeword i. For example, receiver block 202 and interference canceller 204 may correspond to the first stage associated with codeword 1, receiver block 206 and interference canceller 208 may correspond to the second stage associated with codeword 2, and receiver block 256 and interference canceller 258 may correspond to the (C−1)-th stage associated with codeword (C−1). The last stage may include a receiver block associated with codeword C and no interference canceller block, for example, receiver block 260. Although the receiver and interference canceller blocks of FIG. 2 are illustrated as separate blocks, these blocks may be implemented as one or multiple components by a single or multiple integrated circuit boards or devices.

At the first stage, receiver 202 may decode codeword 1 based on a received signal vector y, e.g., received signal vector y from FIG. 1, to generate decoded codeword 1. Interference canceller 204 may receive received signal vector y as well as the decoded codeword 1, as output by receiver 202. Interference canceller 204 may generate an interference-reduced received signal vector $\hat{y}_2$, where the interference due to codeword 1 is cancelled.

At the second stage, receiver 206 may decode codeword 2 based on the interference-reduced received signal vector $\hat{y}_2$ to generate decoded codeword 2. Interference canceller 208 may also receive $\hat{y}_2$ from interference canceller 204 as well as the decoded codeword 2 output by receiver 206. Interference canceller 208 may generate an interference-reduced received signal vector $\hat{y}_3$, where the interferences due to codewords 1 and 2 are cancelled by removing the effect of codeword 2 from the interference-reduced received signal vector $\hat{y}_2$.

Similar to the second stage, a receiver block at an SIC stage i=3, ..., C−1 may decode a codeword i based on an interference-reduced received signal vector $\hat{y}_i$. An interference canceller may output an interference-reduced received signal vector $\hat{y}_{i+1}$, where the interferences due to codewords 1 through i are cancelled.

At the last stage, receiver block 260 may decode codeword C based on interference-reduced received signal vector $\hat{y}_C$ as output by interference canceller 258 of stage (C−1).

Figure 3:
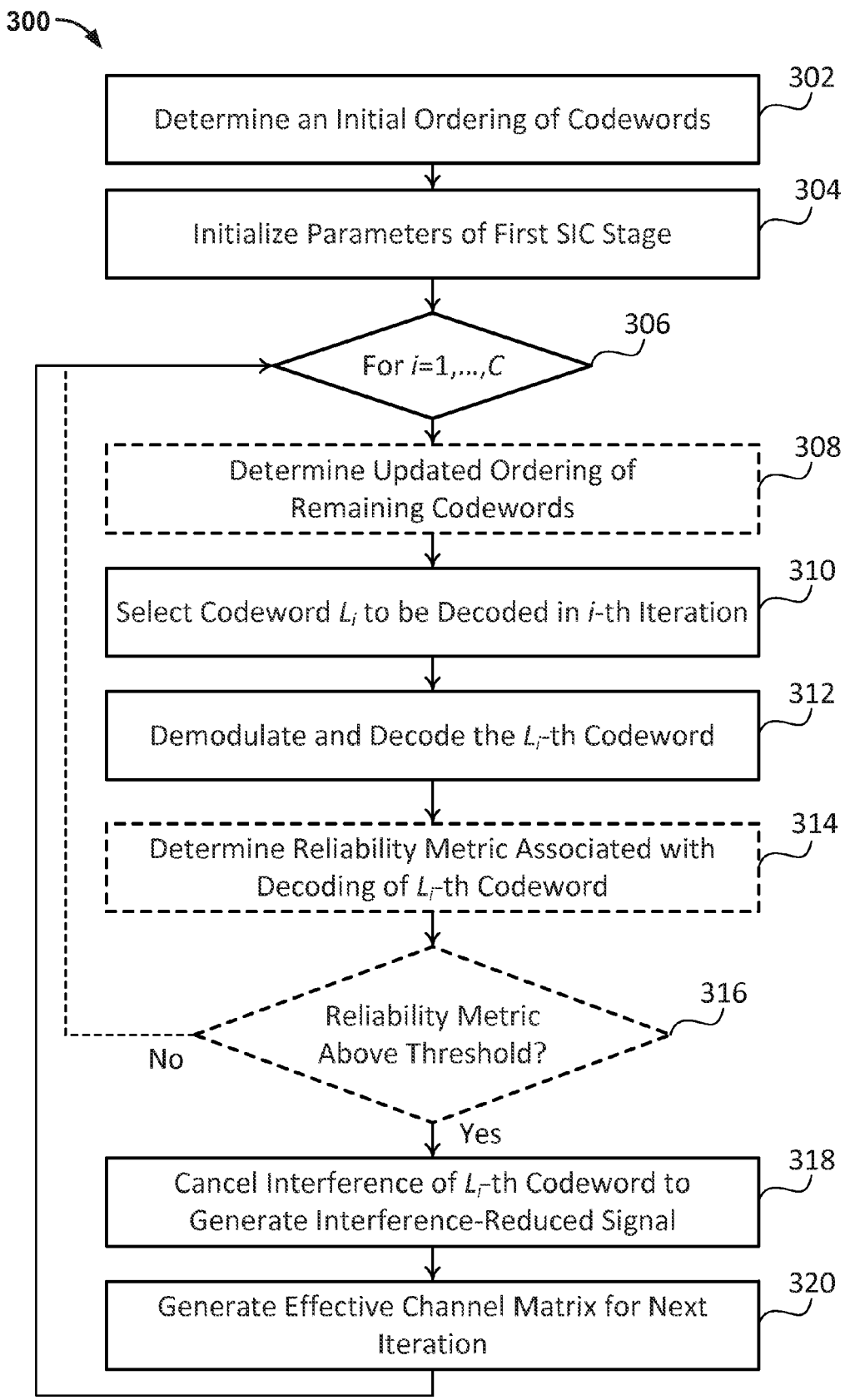
FIG. 3 is a flow diagram illustrating a process for performing SIC, in accordance with some embodiments of the present disclosure.

One example of a SIC process that can be implemented in receiver and interference canceller blocks of FIG. 2 is illustrated in FIG. 3. FIG. 3 is a flow diagram illustrating process 300 for performing SIC at a transmission time t using an exemplary codeword ordering $(L_1, L_2, \ldots, L_C)$. Process 300 includes elements 302-320. In some embodiments, element 312 may be implemented in receiver blocks of FIG. 2 and elements 318 and 320 may be implemented in interference canceller blocks of FIG. 2.

At 302, an ordering for decoding codewords in respective stages of the SIC process at a transmission time t is determined. This ordering may be represented mathematically as $$\{1,2,\ldots,C\} \rightarrow \Pi^{(t)} = (L_1, L_2, \ldots, L_C). \quad \text{EQ. (4)}$$

In other words, the C codewords (e.g., codewords 101 through 105 of FIG. 1) are mapped to an ordered C-tuple or ordering Π. The tuple Π defines the order in which the codewords may be decoded at each SIC stage i=1, ..., C. In the example illustrated in FIG. 2, codewords 1 through C were decoded in that order (i.e., $L_i$=i). However, any suitable ordering Π may be used. Some techniques for determining SIC decoding ordering are described, for example, in co-pending, commonly-assigned U.S. patent application Ser. No. 13/164,111, entitled "METHODS AND APPARATUS FOR MULTIPLE INPUT MULTIPLE OUTPUT (MIMO) SUCCESSIVE INTERFERENCE CANCELLATION (SIC)" and, filed Jun. 20, 2011, which is hereby incorporated by reference herein in its entirety.

At 304, parameters for process 300 may be initialized. For example, the interference-reduced received signal vector $\hat{y}_1$ used by the first stage (e.g., received by the interference cancellation block 204 of FIG. 2) may be initialized to the received signal vector y. In addition, the effective channel matrix $\hat{H}_1$ for the first stage (e.g., used by the receiver 202 and/or interference canceller 204 of FIG. 2) may be initialized to the effective channel matrix H (e.g., effective channel 130 of FIG. 1).

At 306, it is determined whether all C codewords have been decoded. If all codewords have been decoded (i.e., i>C), process 300 may be terminated. Otherwise, if there is any codeword still undecoded (i.e., 1≤i≤C), the codeword may be decoded using 308, 310, 312, 314, 316, 318, and 320. Each iteration for decoding one codeword may correspond to one SIC stage.

At 308, an updated ordering may be determined for codewords that have not yet been decoded. The updated ordering for the codewords that remain to be decoded may differ from the ordering derived at 302, because the cancellation of previously decoded codewords may affect the ordering of the codewords that remain to be decoded. Determining an updated ordering of the remaining codewords is expected to improve the performance of the interference cancellation procedure, but comes at the expense of increased computational complexity. Accordingly, in some embodiments, the initial codeword ordering derived at 302 may be reused and 308 may be omitted.

At 310, a codeword to be decoded at SIC stage i is selected. For example, the codeword i to be decoded at SIC stage i may be determined to be $L_i$, as defined by the ordering generated at 302 or 308.

At 312, the codeword selected at 310, e.g., the $L_i$-th codeword, may be demodulated and/or decoded based on the interference-reduced signal received at the i-th stage, $\hat{y}_i$ and the SIC-adjusted effective channel matrix at the i-th stage, $\hat{H}_i$. This effective channel matrix corresponds to the composite channels for the codewords that have not been decoded at the stage with index (i-1), i.e., $\hat{H}_i = [H_{L_i}, \ldots, H_{L_C}]$. The specific demodulation and decoding methods used at 312 may depend on the receiver implementation.

At 314, a reliability metric may be determined for the $L_i$-th codeword. A large value of the reliability metric may indicate that the $L_i$-th codeword was decoded with a high degree of accuracy, whereas a small value of the reliability metric may indicate a greater likelihood that errors have been introduced as part of the decoding process. Other forms of reliability metrics may also be considered without departing from the scope of this disclosure. For example, a binary reliability metric may indicate whether or not the decoding performance has met a threshold. Such a binary metric may be determined, in some implementations, by computing a cyclic-redundancy check (CRC) or by determining whether the decoded data are consistent with information that is available at both transmitter 110 and receiver 180, such as information that is standardized in a transmission protocol.

At 316, the reliability metric determined at 314 may be compared with a predefined threshold in order to determine whether the decoded $L_i$-th codeword meets a predefined degree of accuracy. If the decoded codeword is deemed reliable enough, process 300 resumes at 318 with the cancellation of the decoded codeword. Otherwise, if the reliability metric is not deemed reliable enough, process 300 may determine that codeword $L_i$ should not be cancelled, instead resuming with the next SIC iteration at 306. Restricting cancellation to codewords that meet a reliability criterion may improve performance in some implementations, because the cancellation of an incorrectly decoded codeword potentially inhibits the successful decoding of any subsequent codewords. Such error propagation may occur because cancellation of an incorrectly decoded codewords introduces additional corruption into the received signal, which potentially far outweighs the corruption that was present prior to performing SIC. Nonetheless, in some implementations, especially when decoding is generally reliable, 314 and 316 may be omitted, resulting in reduced computational complexity.

At 318, the transmitted signal vector is re-encoded and modulated to generate reconstructed transmitted signal vector $\hat{x}_{L_i}$. The interference-reduced received signal vector $\hat{y}_{i+1}$ for stage i+1 is generated by cancelling the interference from the interference-reduced received signal vector $\hat{y}_i$ for stage i. This may be done by subtracting the effect of the reconstructed transmitted signal vector $\hat{x}_{L_i}$ (i.e., as modified by the channels $$\hat{H}_{L_i}^{(k_{L_i})}(m)$$

corresponding to codeword $L_i$) from the interference-reduced received signal vector $\hat{y}_i$:

$$\hat{y}_{i+1}(m) = \hat{y}_i(m) - \hat{H}_{L_i}^{(k_{L_i})}(m)\hat{x}_{L_i}(m).$$

At 320, the effective channel $\hat{H}_{i+1}$ for the stage with index i+1 may be generated. For example, $\hat{H}_{i+1}$ may be generated by deleting the columns corresponding to the channels for the $L_i$-th codeword $$\hat{H}_{i+1}(m) = \hat{H}_i(m) \backslash H_{L_i}^{(k_{L_i})}(m),$$

where A\B denotes the deletion of columns of matrix B from matrix A.

Next, 306 may be checked again. The next codeword, $L_{i+1}$, may be decoded (i.e., i is incremented to i+1), unless all codewords have already been decoded, in which case process 300 may be terminated.

Although process 300 describes SIC using iterative stages, this is meant to be illustrative and is not meant to be limiting or exhaustive. The methods and processes described herein generally apply to other representations of SIC, including QR representations.

The performance of SIC decoding techniques may depend significantly on the ordering of codewords, as illustrated in relation to elements 302 and 308 in FIG. 3. Accordingly, determining a decoding order is an important component of an SIC receiver. It is desirable to determine the decoding order using information that accurately reflects the channel and interference conditions associated with a certain transmission attempt. In some implementations, the information available for determining a codeword order may be limited to long-term information that has been averaged over a large number of transmission attempts. For example, information may be limited to a long-term signal-to-noise ratio or a long-term packet error rate (PER). However, such long-term information associated with prior transmission attempts may not accurately reflect the channel and interference conditions associated with a current transmission attempt. This may sacrifice decoding performance and motivates performing SIC decoding based on posterior information that accurately reflects channel and interference conditions of received vector y.

In some embodiments of the present disclosure, the codeword ordering may be based on the received signal vector y. For example, for any of information bits 101, 103, and 105, a probability metric may be determined that corresponds to the probability that the respective information bits are associated with a logical zero or a logical one, conditioned on the received signal vector y. It is important that the probability metric reflect the conditional probability given the received vector y, because the received vector provides important information for decoding the value of the information bit. In the remainder of this disclosure, these conditional probability metrics are referred to as posterior information or a posteriori information, because they reflect probability metrics post-reception of the received signal.

Posterior information may be expressed in various forms and apply to both bit-level and symbol-level metrics. In some embodiments, the posterior information may be denoted as $p_{k,i}(t)$ and may be derived from the received signal according to $$p_{k,i}(t)=f(b_{k,i}|y(m;t),H(m;t),\sigma_{(t)}^2;1\le m\le M(t)),\qquad\text{EQ. (5)}$$

where y(m;t) refers to the received signal vector, H(m;t) corresponds to the equivalent channel, $\sigma_{(t)}^2$ to the noise variance, and $1\le i\le C$, $1\le k\le D(i)$. In EQ. (5), D(i) denotes the number of information bits contained in the i-th codeword. The equivalent channel and noise may be estimated at the receiver.

Similarly, posterior information may be expressed at a symbol level. The posterior information may be denoted as $p_{m,s}(t)$ and be given by $$p_{m,s}(t)=f(x_s(m)|y(m;t),H(m;t),\sigma_{(t)}^2;1\le m\le M(t)),$$

where $1\le s\le S$, $1\le m\le M(t)$, and M(t) denotes the number of coded symbol vectors in the t-th TTI. The posterior information corresponds to a probability metric conditioned on the received signal as well as channel and noise statistics. However, the posterior information need not necessarily be expressed in form of a probability metric but may also be expressed as a packet error rate (PER), a bit error rate (BER), a log-likelihood ratio, a probability of successful decoding, or using other suitable terms.

In some embodiments, the posterior information may correspond to the mutual information between the received signal vector y(m;t) and the encoded bits of the i-th codeword. In broad terms, the mutual information may be viewed as a measure of the mutual dependence of two random variables. For example, if two random variables are statistically independent, then knowledge of one of the random variables does not provide any information about the other random variable. The mutual information of these two variables is therefore zero. In contrast, if the two variables can be derived deterministically from one another (e.g., when the first random variable is a deterministic function of the second random variable), then the mutual information is large because all information conveyed by one of the random variables is shared with the other random variable. For determining an SIC decoding order, it may be desirable to maximize the mutual information between the received signal vector y(m;t) and the encoded bits or symbols of a given codeword. In some embodiments, using mutual information as posterior information may be more reliable than other probability metrics. Mutual information metrics are also described, for example, in co-pending, commonly-assigned U.S. patent application Ser. No. 13/164,111, entitled "METHODS AND APPARATUS FOR MULTIPLE INPUT MULTIPLE OUTPUT (MIMO) SUCCESSIVE INTERFERENCE CANCELLATION (SIC)" and, filed Jun. 20, 2011, which is hereby incorporated by reference herein in its entirety.

In some embodiments, the ordering of the codewords may be recomputed after SIC has been applied to one or more codewords, as was discussed in relation to element 314 in FIG. 3. If such recomputation is performed, then the posterior information may take this cancellation into account.

In some embodiments of the present disclosure, the codeword ordering may further depend on both the posterior information and the coding rate $R_i$ associated with codeword i. The coding rate $R_i$ may be known by receiver 180, either because it is predetermined or because the coding rate is conveyed from the transmitter to the receiver (e.g., using some form of control signaling). It is beneficial to take the coding rate of codeword i into account as part of determining the decoding order because the coding rate impacts the likelihood that a codeword can be decoded correctly. For example, assuming that two codewords are received at the same signal-to-noise ratio and that a first of the two codewords has a smaller coding rate than the second codeword, the first codeword should be decoded earlier than the second codeword because the smaller coding rate enables more reliable decoding of the first codeword. Accordingly, by decoding the first codeword earlier than the second, it is more likely that the first codeword will be decoded correctly, and that the subsequent cancellation of the first codeword's interference will be performed correctly. In embodiments that utilize both the posterior information of the received signal and the coding rate for determining a decoding order, the decoding order may be expressed mathematically as $$\Pi^{(t)}=g(p_{k,i},R_i(t);1\le i\le C,\ 1\le k\le D(i)),$$

where g(•) is a suitable function that maps the posterior information $p_{k,i}$ and the coding rate $R_i$ to a decoding order $\Pi^{(t)}$. Various examples for function g(•) will be provided in this disclosure.

As is discussed in relation to element 302 in FIG. 2, the decoding order may be determined prior to performing the iterative cancellation of codewords. Alternatively, the codeword ordering may be determined anew after the iterative decoding of each of the C codewords. Doing so may improve the decoding performance, because the cancellation of the previous codeword affects the received signal y(m,t). Therefore, the ordering associated with the remaining codewords after having cancelled one or more codewords may differ from the initial decoding order that was determined before SIC was applied to the first codeword. However, such recomputation of the decoding order comes at the expense of higher computational complexity, because the ordering procedure needs to be performed for each SIC iteration instead of only once.

In some embodiments, the codeword ordering may be based on posterior information that takes into account information associated with previous transmission attempts. For example, in a transmission system that utilizes a retransmission protocol, a previous transmission attempt may contain important information about the information bits contained in codeword i, and such information from the previous transmission attempt should therefore be taken into account together with information associated with later transmission attempts. Accordingly, EQ. (5) may be modified such that $p_{k,i}(t)$ corresponds to a conditional probability that is conditioned on both the current and previous transmission attempts. The current and previous transmission attempts may be denoted as sequence $\tau=t_i(1),\ldots,t_i(k_i)$, where i is the codeword index and $k_i$ denotes the previous decoding attempts. The posterior information encompassing the current and prior transmission attempts then becomes $$p_{k,i}(t)=f(b_{k,i}|y(m;\tau),H(m,\tau),\sigma^{(\tau)^2},1\le m\le M,\tau)$$

for $1\le i\le C$ and $1\le k\le D(i)$. Although not shown, posterior information encompassing retransmission attempts may similarly be expressed at a symbol level.

FIG. 4 shows the determination of the decoding order $\Pi^{(t)}$ at time instance t based on averaged posterior information. For each codeword, an average posterior information is calculated and normalized by the codeword's coding rate to obtain $$\overline{p}_i=\frac{1}{D(i)R_i}\sum_{k=1}^{D(i)}p(k,i).$$

Codeword ordering 410 shows that $\Pi^{(t)}$ is given by the C-tupel of ordered codewords indices, $L_1,\ldots,L_C$, for which the condition corresponding to elements 412a, 412b, and 412c is satisfied. Each of elements 412a, 412b, and 412c corresponds to codeword level posterior information associated with one of the codewords. In particular, elements 412a, 412b, and 412c are ordered such that 412a corresponds to the codeword with the largest metric, 412b corresponds to the codeword with second largest metric, and 412c corresponds to the codeword with smallest metric (possibly subject to ties). The ordering condition provided by elements 412a, 412b, and 412c therefore ensures that $L_1$ is the codeword index of the codeword with largest posterior information metric, $L_2$ is the second largest, etc.

In some embodiments, posterior information may be expressed in form of log-likelihood ratios (LLRs). In a communication system that uses retransmissions, the LLR of the k-th encoded bit of codeword i may be calculated as $$LLR(k, i) = \log \frac{P\left(\begin{array}{l} b_{k,i} = 1 \mid y(m; \tau), H(m, \tau)\sigma^{(t)2}; \\ 1 \le m \le M, \tau = t_i(1), \ldots, t_i(k_i) \end{array}\right)}{P\left(\begin{array}{l} b_{k,i} = 0 \mid y(m; \tau), H(m, \tau)\sigma^{(t)2}; \\ 1 \le m \le M, \tau = t_i(1), \ldots, t_i(k_i) \end{array}\right)} \quad \text{EQ. (6)}$$

The LLR therefore reflects the logarithm of a ratio between the probability that the k-th information bit of codeword i is a logical one and the probability that said information bit is a logical zero. Accordingly, a large positive value of the LLR indicates that the information bit is likely a logical one. Conversely, a negative LLR with large magnitude indicates that the information bit is likely a logical zero. In case that, for some reason, the k-th information bit of codeword i is not transmitted, then LLR(k,i) may be set to zero, reflecting the fact that no information about said information bit is available at the receiver.

In embodiments where LLRs are used as the posterior information, the codeword order may be expressed as $$\Pi^{(t)} = g(LLR(k,i), R_i(t); k=1, \ldots, D(i), i=1, \ldots, C).$$

As LLRs are defined on a bit level, they may reflect the impact of the signal-to-noise ratio associated with the current and/or prior transmission attempts, as well as the modulation and coding rate. A further benefit of using LLRs to express posterior information is that punctured bits (i.e., encoded bits that are not transmitted in a certain transmission attempt) may be easily modeled in the decoding process by setting their associated LLR to zero. Similarly, the information of past transmission attempts may be combined with the information of the current transmission attempt by utilizing combining methods such as chase combining or incremental redundancy. These methods allow the information associated with both the past and the current transmission attempts to be expressed by a single LLR. Lastly, LLRs are frequently used in receivers, even when SIC is not applied. Accordingly, receivers may already possess functionality for computing, storing, and processing LLRs. In such implementations, it may be desirable to reuse this functionality by relying on LLRs for determining the decoding order.

In accordance with the preceding paragraphs, LLRs may be defined on a bit level, that is, per information bit. However, in order to determine a decoding order, it may be necessary to determine a metric that reflects the channel and interference conditions corresponding to the codeword as a whole. Such codeword-level metrics, may be obtained in various forms, such as by averaging over the LLR metrics defined per information bit.

In some embodiments, the average LLR magnitude of a codeword may be defined by $$\overline{LLR}(i) = \frac{1}{D(L_i)} \sum_{k=1}^{D(L_i)} |LLR(k, i)|, \quad \text{EQ. (7)}$$

where D(i) denotes the number of information bits in codeword i. Utilizing the above metric is motivated by two observations. First, the magnitude of the LLR serves as an indication of the likelihood that an information bit is either a logical zero or a logical one. A large magnitude of the LLR indicates that the information bit is likely going to be a logical one (if the LLR is positive) or that the information bit is likely to correspond to a logical zero (if the LLR is negative). If the magnitude of the LLR is small, then the information about the information bit is less reliable. For SIC decoding, the reliability with which information bits can be decoded is the information of interest (but not whether a certain bit corresponds to a logical zero or a logical one). Accordingly, the magnitude of the LLR reflects important information for determining the codeword order. Second, computing the average LLR magnitude over the information bits in the codeword is motivated by the fact that a single metric per codeword is convenient for determining the decoding order. The average LLR magnitude reflects the average reliability associated with the decoding of the information bits in a certain codeword. However, other operations may be considered such as taking the median of the LLR magnitudes in a codeword.

FIG. 4 shows the determination of the decoding order $\Pi^{(t)}$ at time instance t based on the averaged posterior information derived in EQ. 5. Codeword ordering 430 shows that $\Pi^{(t)}$ is given by the C-tuple of ordered codewords indices, $L_1, \ldots, L_C$, for which the condition associated with elements 432a and 432b is satisfied. Each of elements 432a and 432b corresponds to codeword level posterior information associated with one of the codewords. In particular, elements 432a and 432b are ordered such that 412a corresponds to the codeword with the largest metric and 412b corresponds to the codeword with smallest metric (possibly subject to ties). The ordering condition provided by elements 432a and 432b therefore ensures that $L_1$ is the codeword index of the codeword with largest posterior information metric, $L_2$ is the second largest, etc.

In some embodiments, LLR information may be converted to a different metric, and the decoding order may be determined based on that metric instead of based on the LLR information. For example, based on the LLR of the k-th information bit in codeword i the bit error rate for said information bit $$P_e(k, i) = \frac{1}{1 + e^{|LLR(k,i)|}}$$

may be used. Like the LLR, the bit error probability $P_e(k,i)$ is defined on a bit level and may need to be converted to a per-codeword metric in order to facilitate the determination of the decoding order. For example, the average bit error rate may be chosen, which for codeword i is defined by $$\overline{P}(i) = \frac{1}{D(L_i)} \sum_{k=1}^{D(L_i)} P_e(k, i)$$

The codeword ordering that reflects the above metric is shown at 450 in FIG. 4.

Instead of averaging across information bits contained in a codeword, the bit error probability may be used to determine the probability of successful decoding for the entire codeword, which is given by $$P(i) = \prod_{k=1}^{D(i)} (1 - P_e(k, i))$$

The probability of successful encoding is defined per codeword and may be used, additionally or alternatively, to determine the decoding order for SIC decoding.

In some embodiments of the present disclosure, mutual information may be used to determine the codeword ordering. For the k-th information bit of codeword i the mutual information may be given by $$MI(k,i) = I(b_{k,i}; y(m,\tau)|H(m;\tau), \sigma^{(i)^2}, 1 \le m \le M(\tau), \tau = t_i(1), \ldots, t_i(k_i)),$$

where I(X;Y) denotes the mutual information between random variables X and Y. The mutual information may be computed based on LLR information, such as by $$MI(k,i) = I(b_{k,i}; LLR(k,i)). \quad \text{EQ. (8)}$$

The mutual information MI(k,i) corresponding to the k-th information bit of codeword i may be approximated based on the LLR information associated with said information bit b using the following approximation $$MI(k, i) = 1 + \frac{1}{1 + e^{|LLR(k,i)|}} \log_2 \frac{1}{1 + e^{|LLR(k,i)|}} + \quad \text{EQ. (9)}$$
$$\frac{e^{|LLR(k,i)|}}{1 + e^{|LLR(k,i)|}} \log_2 \frac{e^{|LLR(k,i)|}}{1 + e^{|LLR(k,i)|}}.$$

For punctured bits (i.e., for encoded bits that were not transmitted), the mutual information may be defined as zero, similar to the LLR associated with punctured bits.

In embodiments that utilize mutual information for codeword ordering, the ordering may be determined based on the mutual information defined at the bit level and the coding rate of the codeword as follows $$\Pi^{(t)} = g(MI(k,i), R_i(t); k=1, \ldots, D(i), i=1, \ldots, C)$$

Similar to implementations in which the posterior information is based on LLR information, the mutual information may also need to be converted from a bit level to a codeword level in order to perform codeword ordering. This may be performed by averaging the mutual information per information bit across all the information bits in a codeword. Mathematically, this can be expressed as $$\overline{MI}(i) = \frac{1}{R_i(t)} \sum_{k=1}^{D(i)} MI(k, i)/D(i).$$

The codeword ordering that reflects the above metric is shown at 470 in FIG. 4. Alternatively, codewords may be assigned a mutual information metric by determining the median value of the mutual information across the information bits contained in the codeword. Normalization by the coding rate of codeword i may again be performed. This metric may be expressed mathematically as $$\frac{1}{R_i(t)} \text{median}\{MI(k, i), k = 1, \ldots, D(i)\}.$$

The codeword ordering that reflects the above metric is shown at 490 in FIG. 4.

Similar to LLR based information, mutual information may be defined per information bit and may take into account the impact of signal-to-noise ratio, modulation rate, and coding rate. Likewise, mutual information can also easily accommodate punctured bits by setting the value of the mutual information to zero. Retransmissions may be taken into account, for example, by adjusting the LLR metrics in EQ. 8 in accordance with EQ. 6. In some implementations, it may be an important consideration that the mutual information can be derived from bit level LLR information by using approximations such as the one shown in EQ. 9. Accordingly, a receiver that stores LLR information as part of its decoding process may be adapted more easily to accommodate codeword ordering based on mutual information. For example, it may not be necessary to store bit-level mutual information separately, because the bit-level mutual information may be derived using approximations such as the one in EQ. 9. From an implementation perspective, this may be an important benefit because it obviates the need to store both bit-level LLR information and bit-level mutual information.

Figure 5:
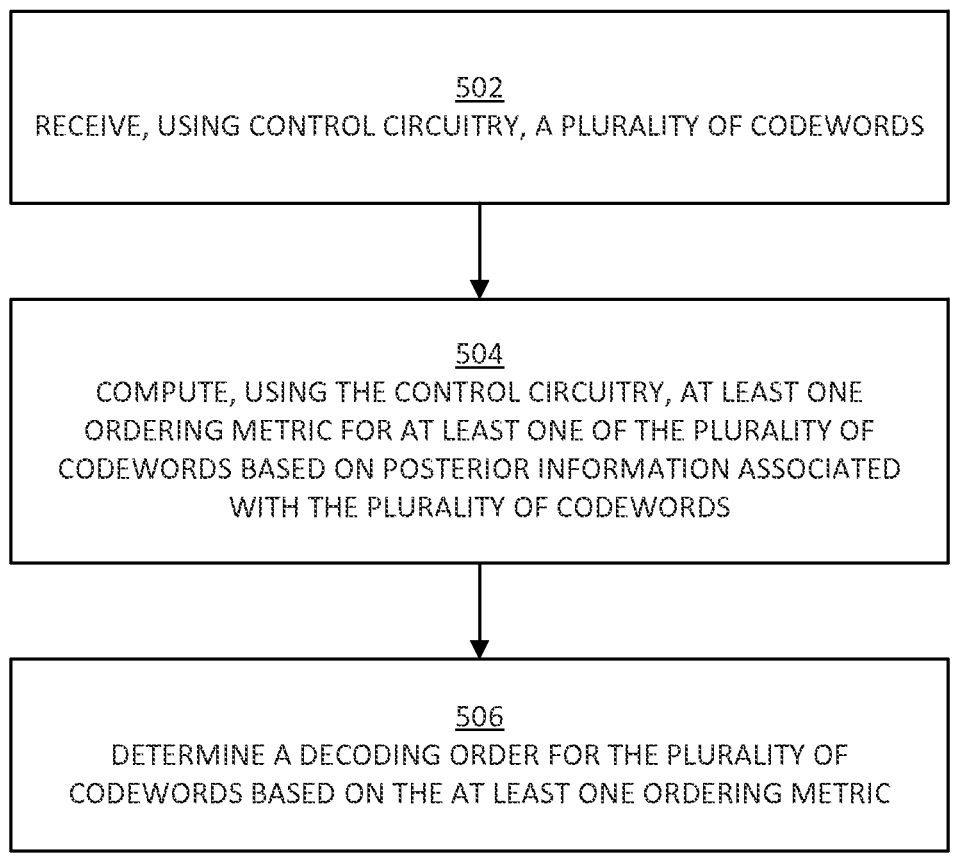
FIG. 5 is a high-level flow diagram of a method for determining a decoding order in a SIC receiver, in accordance with some embodiments of the present disclosure.

FIG. 5 is a high-level flow chart of a process 500 for determining a decoding order in a successive interference cancellation receiver, in accordance with an embodiment of the present disclosure. A receiver 180 may execute process 500 by receiving, using control circuitry, a plurality of codewords at 502. Process 500 further includes, at 504, computing, using the control circuitry, at least one ordering metric for at least one of the plurality of codewords based on posterior information and, at 506, determining the decoding order based on the at least one ordering metric.

At 502, a plurality of codewords is received. These codewords may be transmitted at a transmission time t. In some embodiments, a transmission time t may be defined as an index of a particular transmission time interval (TTI). For example, a subframe may correspond to a TTI for the Physical Downlink Shard Channel (PDSCH) of an LTE protocol, and transmission time t may correspond to an identifier of that subframe (i.e., t=Subframe_ID).

At 504, at least one ordering metric is computed for at least one of the plurality of codewords, based on posterior information associated with the plurality of codewords. For example, ordering metric $\gamma_i(t)$ may be computed for codeword i. The ordering metric may be determined based on the channel and interference conditions associated with codeword i at transmission time t. In particular, ordering metric $\gamma_i(t)$ may be determined based on bit-level or symbol-level posterior information associated with the information bits of codeword i by considering log-likelihood ratios, mutual information, bit error rate, a probability of successful decoding, or any combination of these metrics. In transmission systems with retransmission protocols, the ordering metric $\gamma_i(t)$ may be determined based on codeword i as received at transmission time t and based on previous transmission attempts associated with the codeword.

At 506, a decoding order for the plurality of codewords is determined based on the at least one ordering metric. The decoding order $\Pi^{(t)}$ may be represented as $$\Pi^{(t)} = (L_1, L_2, \ldots, L_C),$$

where $L_i$ denotes the index of the codeword that is decoded at the i-th step. In some embodiments, the ordering defined by $\Pi^{(t)}$ may be determined by sorting the codewords based on their ordering metrics $\gamma_i(t)$ from highest to lowest. Mathematically, this can be expressed as $$\Pi^{(t)}=\{L_1,L_2,\ldots,L_C|\gamma_{L_1}\geq\ldots\geq\gamma_{L_C}\}.$$

In some embodiments, the decoding order determined at 506 may be computed once at the beginning of the SIC decoding process. In other embodiments, the decoding order may be recomputed at the beginning of each SIC iteration, i.e., every time a codeword has been cancelled from the receive signal.

Figure 6:
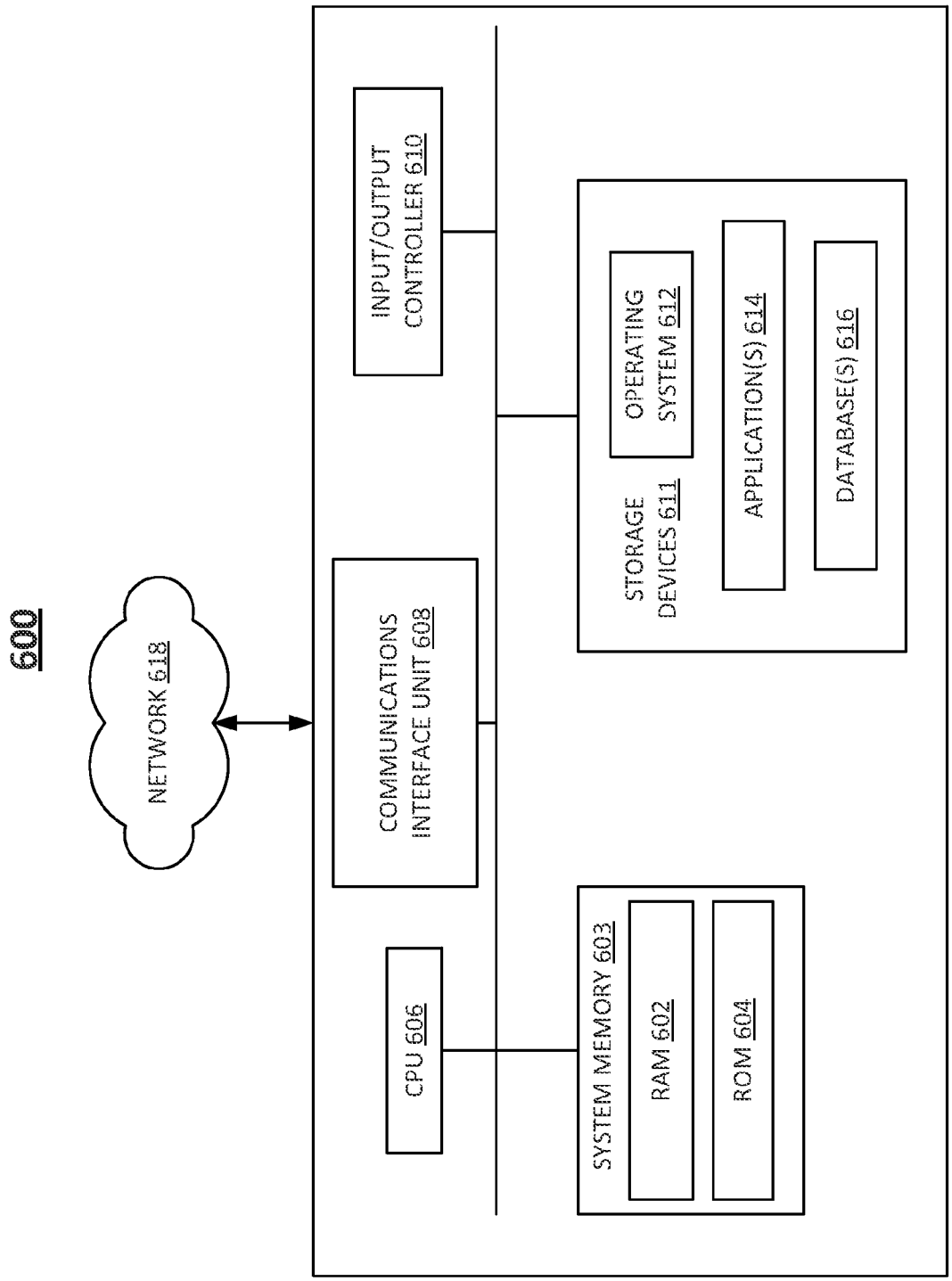
FIG. 6 shows a block diagram of a computing device, for performing any of the processes described herein, in accordance with an embodiment of the present disclosure.

FIG. 6 is a block diagram 600 of a computing device, such as any of the components of the system of FIG. 1, for performing any of the processes described herein, in accordance with an embodiment of the disclosure. Each of the components of these systems may be implemented on one or more computing devices 600. In certain aspects, a plurality of the components of these systems may be included within one computing device 600. In certain embodiments, a component and a storage device 611 may be implemented across several computing devices 600.

The computing device 600 comprises at least one communications interface unit 608, an input/output controller 610, system memory 603, and one or more data storage devices 611. The system memory 603 includes at least one random access memory (RAM 602) and at least one read-only memory (ROM 604). All of these elements are in communication with a central processing unit (CPU 606) to facilitate the operation of the computing device 600. The computing device 600 may be configured in many different ways. For example, the computing device 600 may be a conventional standalone computer or alternatively, the functions of computing device 600 may be distributed across multiple computer systems and architectures. In FIG. 6, the computing device 600 is linked, via network 618 or local network, to other servers or systems.

The computing device 600 may be configured in a distributed architecture, wherein databases and processors are housed in separate units or locations. Some units perform primary processing functions and contain at a minimum a general controller or a processor and a system memory 603. In distributed architecture embodiments, each of these units may be attached via the communications interface unit 608 to a communications hub or port (not shown) that serves as a primary communication link with other servers, client or user computers and other related devices. The communications hub or port may have minimal processing capability itself, serving primarily as a communications router. A variety of communications protocols may be part of the system, including, but not limited to: Ethernet, SAP, SAS™, ATP, BLUETOOTH™, GSM and TCP/IP.

The CPU 606 comprises a processor, such as one or more conventional microprocessors and one or more supplementary co-processors such as math co-processors for offloading workload from the CPU 606. The CPU 606 is in communication with the communications interface unit 608 and the input/output controller 610, through which the CPU 606 communicates with other devices such as other servers, user terminals, or devices. The communications interface unit 608 and the input/output controller 610 may include multiple communication channels for simultaneous communication with, for example, other processors, servers or client terminals.

The CPU 606 is also in communication with the data storage device 611. The data storage device 611 may comprise an appropriate combination of magnetic, optical or semiconductor memory, and may include, for example, RAM 602, ROM 604, flash drive, an optical disc such as a compact disc or a hard disk or drive. The CPU 606 and the data storage device 611 each may be, for example, located entirely within a single computer or other computing device; or connected to each other by a communication medium, such as a USB port, serial port cable, a coaxial cable, an Ethernet cable, a telephone line, a radio frequency transceiver or other similar wireless or wired medium or combination of the foregoing. For example, the CPU 606 may be connected to the data storage device 611 via the communications interface unit 608. The CPU 606 may be configured to perform one or more particular processing functions.

The data storage device 611 may store, for example, (i) an operating system 612 for the computing device 600; (ii) one or more applications 614 (e.g., computer program code or a computer program product) adapted to direct the CPU 606 in accordance with the systems and methods described here, and particularly in accordance with the processes described in detail with regard to the CPU 606; or (iii) database(s) 616 adapted to store information that may be utilized to store information required by the program.

The operating system 612 and applications 614 may be stored, for example, in a compressed, an uncompiled and an encrypted format, and may include computer program code. The instructions of the program may be read into a main memory of the processor from a computer-readable medium other than the data storage device 611, such as from the ROM 604 or from the RAM 602. While execution of sequences of instructions in the program causes the CPU 606 to perform the process steps described herein, hard-wired circuitry may be used in place of, or in combination with, software instructions for embodiment of the processes of the present disclosure. Thus, the systems and methods described are not limited to any specific combination of hardware and software.

Suitable computer program code may be provided for performing one or more functions in relation to determining a decoding order of a SIC receiver as described herein. The program also may include program elements such as an operating system 612, a database management system and "device drivers" that allow the processor to interface with computer peripheral devices (e.g., a video display, a keyboard, a computer mouse, etc.) via the input/output controller 610.

The term "computer-readable medium" as used herein refers to any non-transitory medium that provides or participates in providing instructions to the processor of the computing device 600 (or any other processor of a device described herein) for execution. Such a medium may take many forms, including, but not limited to, non-volatile media and volatile media. Non-volatile media include, for example, optical, magnetic, or opto-magnetic disks, or integrated circuit memory, such as flash memory. Volatile media include dynamic random access memory (DRAM), which typically constitutes the main memory. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, an EPROM or EEPROM (electronically erasable programmable read-only memory), a FLASH-EEPROM, any other memory chip or cartridge, or any other non-transitory medium from which a computer may read.

Various forms of computer readable media may be involved in carrying one or more sequences of one or more instructions to the CPU 606 (or any other processor of a device described herein) for execution. For example, the instructions may initially be borne on a magnetic disk of a remote computer (not shown). The remote computer may load the instructions into its dynamic memory and send the instructions over an Ethernet connection, cable line, or even telephone line using a modem. A communications device local to a computing device 600 (e.g., a server) may receive the data on the respective communications line and place the data on a system bus for the processor. The system bus carries the data to main memory, from which the processor retrieves and executes the instructions. The instructions received by main memory may optionally be stored in memory either before or after execution by the processor. In addition, instructions may be received via a communication port as electrical, electromagnetic or optical signals, which are exemplary forms of wireless communications or data streams that carry various types of information.

While various embodiments of the present disclosure have been shown and described herein, it will be obvious to those skilled in the art that such embodiments are provided by way of example only. Numerous variations, changes, and substitutions will now occur to those skilled in the art without departing from the disclosure. It should be understood that various alternatives to the embodiments of the disclosure described herein may be employed in practicing the disclosure. It is intended that the following claims define the scope of the disclosure and that methods and structures within the scope of these claims and their equivalents be covered thereby.

The foregoing is merely illustrative of the principles of this disclosure and various modifications can be made without departing from the scope of the present disclosure. The above described embodiments of the present disclosure are presented for purposes of illustration and not of limitation, and the present disclosure is limited only be the claims which follow.

What is claimed is:

1. A method for decoding in a successive interference cancellation receiver, the method comprising:
    receiving, using control circuitry, a plurality of codewords;
    computing, using the control circuitry, at least one ordering metric for at least one of the plurality of codewords based on posterior information associated with the plurality of codewords; and
    determining a decoding order for the plurality of codewords based on the at least one ordering metric.

2. The method of claim 1, wherein the posterior information comprises at least one of log-likelihood ratio (LLR) information, mutual information, and bit error rate (BER) information.

3. The method of claim 2, wherein computing the at least one ordering metric for the at least one of the plurality of codewords is further based on a coding rate corresponding to the at least one of the plurality of codewords.

4. The method of claim 1, wherein the posterior information comprises log-likelihood ratios (LLRs), and computing the at least one ordering metric for the at least one of the plurality of codewords comprises:
    averaging a magnitude of the LLRs across information bits associated with the at least one of the plurality of codewords to obtain an average LLR magnitude; and
    determining the at least one ordering metric for the at least one of the plurality of codewords based on the average LLR magnitude.

5. The method of claim 1, wherein the posterior information comprises bit-level log-likelihood ratios (LLRs), and computing the at least one ordering metric for the at least one of the plurality of codewords comprises:
    computing a bit error rate metric for bits in the at least one of the plurality of codewords based on the bit-level LLRs;
    averaging the bit error rate metric across the bits in the at least one of the plurality of codewords to obtain an average bit error rate metric; and
    determining the at least one ordering metric for the at least one of the plurality of codewords based on the average bit error rate metric.

6. The method of claim 1, wherein the posterior information comprises bit-level log-likelihood ratios (LLRs), and computing the at least one ordering metric for the at least one of the plurality of codewords comprises:
    computing a probability of successful decoding for the at least one the plurality of codewords based on the bit-level LLRs; and
    determining the at least one ordering metric for the at least one of the plurality of codewords based on the probability of successful decoding.

7. The method of claim 1, wherein the posterior information comprises bit-level mutual information, and computing the at least one ordering metric for the at least one of the plurality of codewords comprises:
    computing a codeword-level mutual information metric by one of averaging the bit-level mutual information across information bits in the at least one of the plurality of codewords or determining a median value of the bit-level mutual information across the information bits in the at least one of the plurality of codewords;
    normalizing the codeword-level mutual information metric by a coding rate associated with the at least one of the plurality of codewords; and
    determining the at least one ordering metric for the at least one of the plurality of codewords based on the normalized codeword-level mutual information metric.

8. The method of claim 1, wherein one of the plurality of codewords is a retransmitted codeword; and
    the posterior information comprises information associated with previous transmissions of the retransmitted codeword.

9. The method of claim 1, further comprising:
    selecting a codeword of the plurality of codewords based on a rank of the codeword in the decoding order;
    decoding the selected codeword in response to the selecting; and
    canceling interference associated with the selected codeword.

10. The method of claim 9, further comprising:
    determining a reliability metric associated with the selected codeword in response to the decoding; and
    canceling the interference from the decoded given codeword if the reliability metric exceeds a predefined threshold.

11. A receiver for decoding codewords using successive interference cancellation, the receiver comprising:
    control circuitry configured to receive a plurality of codewords; and
    decoding circuitry configured to:
        compute at least one ordering metric for at least one of the plurality of codewords based on posterior information associated with the plurality of codewords, and
        determine a decoding order for the plurality of codewords based on the at least one ordering metric.

12. The receiver of claim 11, wherein the posterior information comprises at least one of log-likelihood ratio (LLR) information, mutual information, and bit error rate (BER) information.

13. The receiver of claim 12, wherein the decoding circuitry is further configured to compute the at least one ordering metric for the at least one of the plurality of codewords based on a coding rate corresponding to the at least one of the plurality of codewords.

14. The receiver of claim 11, wherein the posterior information comprises log-likelihood ratios (LLRs), and wherein the decoding circuitry is further configured to compute the at least one ordering metric for the at least one of the plurality of codewords by:
- averaging a magnitude of the LLRs across information bits associated with the at least one of the plurality of codewords to obtain an average LLR magnitude; and
- determining the at least one ordering metric for the at least one of the plurality of codewords based on the average LLR magnitude.

15. The receiver of claim 11, wherein the posterior information comprises bit-level log-likelihood ratios (LLRs), and wherein the decoding circuitry is further configured to compute the at least one ordering metric for the at least one of the plurality of codewords by:
- computing a bit error rate metric for bits in the at least one of the plurality of codewords based on the bit-level LLRs;
- averaging the bit error rate metric across the bits in the at least one of the plurality of codewords to obtain an average bit error rate metric; and
- determining the at least one ordering metric for the at least one of the plurality of codewords based on the average bit error rate metric.

16. The receiver of claim 11, wherein the posterior information comprises bit-level log-likelihood ratios (LLRs), and wherein the decoding circuitry is further configured to compute the at least one ordering metric for the at least one of the plurality of codewords by:
- computing a probability of successful decoding for the at least one of the plurality of codewords based on the bit-level LLRs; and
- determining the at least one ordering metric for the at least one of the plurality of codewords based on the probability of successful decoding.

17. The receiver of claim 11, wherein the posterior information comprises bit-level mutual information, and wherein the decoding circuitry is further configured to compute the at least one ordering metric for the at least one of the plurality of codewords by:
- computing a codeword-level mutual information metric by one of averaging the bit-level mutual information across information bits in the at least one of the plurality of codewords or determining a median value of the bit-level mutual information across the information bits in the at least one of the plurality of codewords;
- normalizing the codeword-level mutual information metric by a coding rate associated with the at least one of the plurality of codewords; and
- determining the at least one ordering metric for the at least one of the plurality of codewords based on the normalized codeword-level mutual information metric.

18. The receiver of claim 11, wherein one of the plurality of codewords is a retransmitted codeword; and
- the posterior information comprises information associated with previous transmissions of the retransmitted codeword.

19. The receiver of claim 11, wherein the decoding circuitry is further configured to:
- select a codeword of the plurality of codewords based on a rank of the codeword in the decoding order;
- decode the selected codeword in response to the selecting; and
- cancel interference associated with the selected codeword.

20. The receiver of claim 19, wherein the decoding circuitry is further configured to:
- determine a reliability metric associated with the selected codeword in response to the decoding; and
- cancel the interference from the decoded given codeword if the reliability metric exceeds a predefined threshold.

* * * * *